(12) United States Patent
Song

(10) Patent No.: US 9,565,765 B2
(45) Date of Patent: Feb. 7, 2017

(54) PRINTED CIRCUIT BOARD

(71) Applicant: Shenzhen China Star Optoelectronics Technology Co., Ltd., Shenzhen, Guangdong (CN)

(72) Inventor: Lijia Song, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 173 days.

(21) Appl. No.: 14/420,373

(22) PCT Filed: Nov. 10, 2014

(86) PCT No.: PCT/CN2014/090754
§ 371 (c)(1),
(2) Date: Feb. 8, 2015

(87) PCT Pub. No.: WO2016/070441
PCT Pub. Date: May 12, 2016

(65) Prior Publication Data
US 2016/0128190 A1    May 5, 2016

(30) Foreign Application Priority Data

Nov. 4, 2014    (CN) .......................... 2014 1 0614822

(51) Int. Cl.
*H05K 1/18* (2006.01)
*H05K 1/11* (2006.01)

(52) U.S. Cl.
CPC ............... *H05K 1/181* (2013.01); *H05K 1/111* (2013.01); *H05K 2201/094* (2013.01); *H05K 2201/09418* (2013.01); *H05K 2201/10022* (2013.01)

(58) Field of Classification Search
CPC ...................................................... H05K 1/181
See application file for complete search history.

(56) References Cited

U.S. PATENT DOCUMENTS

| | | | |
|---|---|---|---|
| 2007/0145575 A1* | 6/2007 | Mori | H05K 1/023 257/723 |
| 2011/0011636 A1* | 1/2011 | Oh | H05K 1/167 174/260 |
| 2016/0021750 A1* | 1/2016 | Ang | H05K 1/18 174/260 |

* cited by examiner

*Primary Examiner* — Jeremy C Norris
(74) *Attorney, Agent, or Firm* — Andrew C. Cheng

(57) ABSTRACT

A printed circuit board is disclosed. Pins of a plurality of resistors on the PCB are connected to the same input line. At least two out of the resistors are connected to the same input line with access pins overlapped. One shared bonding pad is located in every overlapped area, electrical components are bonded on the shared bonding pads. As at least two out of the resistors are connected to the same input line with the access pins overlapped, the utilization of space is maximized. In this way, not only the dimension of the PCB is reduced, but also the manufacturing cost is reduced at the same time.

9 Claims, 5 Drawing Sheets

PRINTED CIRCUIT BOARD

BACKGROUND OF THE INVENTION

1. Field of the Invention

The present disclosure relates to circuit board manufacturing technology, and more particularly to a printed circuit board (PCB).

2. Discussion of the Related Art

Generally, PCBs include a plurality of components welded thereon. The more the components have been welded, the larger the PCB is needed, and the higher the manufacturing cost.

As shown in FIG. 1, the first resistor R1 and the second resistor R2 respectively include a first bonding pad S01 and a second bonding pad S02. One pin of the first resistor R1 connects to the first bonding pad S01, and one pin of the second resistor R2 connects to the second bonding pad S02. Afterward, the first bonding pad S01 and the second bonding pad S02 are electrically connected. Also referring to FIG. 2, the PCB includes a plurality of output line O1, O2, ... and On, wherein the n is an integer larger than or equal to 2. Usually, the input line I0 is connected to another pin of the first resistor R1 when one component has to be connected to one output line O1. Afterward, the electrical component is mounted on the first bonding pad S01. However, only one bonding pad of the PCB is connected with the input line I0, and it can be understood that other bonding pads are idle, which not only waste the space of the PCB, but also increase the manufacturing cost.

SUMMARY

In order to overcome the above-mentioned problem, the PCB of the claimed invention not only makes maximum utilization of space, but also can save manufacturing cost.

In one aspect, a printed circuit board (PCB) includes: pins of a plurality of resistors on the PCB being connected to the same input line, at least two out of the resistors are connected to the input line with their access pins overlapped, one shared bonding pad is located in every overlapped area, and at least one electrical component is bonded on the shared bonding pads.

Wherein the two out of the resistors are connected to the input line with their access pins overlapped, one shared bonding pad is located in the overlapped area, and the two resistors are arranged in line.

Wherein two out of the resistors are connected to the input line with their access pins overlapped, one shared bonding pad is located in the overlapped area, and the two resistors are vertical to each other.

Wherein three out of the resistors are connected to the input line with their access pins overlapped, one shared bonding pad is located in the overlapped area, and two out of the three resistors are arranged in line, and the two resistors are vertical to the other resistor.

Wherein four out of the resistors are connected to the input line with their access pins overlapped, one shared bonding pad is located in the overlapped area, and every resistor out of the four resistors is arranged to be vertical to each other two the nearby one.

Wherein when the number of the resistors connecting to the same input line is larger than four, a plurality of adjacent shared bonding pads are electrically connected, and at least one of the shared bonding pad is connected to the input line.

Wherein the PCB comprises two shared bonding pads, five resistors are connected to the same input line, three out of the five resistors are connected to the input line with their access pins overlapped with one shared bonding pad is located in the overlapped area, symmetrically arranged at two sides of the connecting line of the shared bonding pads, and vertical to the other resistor; and the other two out of the five resistors are connected to the input line with their access pins overlapped with another shared bonding pad located in the overlapped area, symmetrically arranged at two sides of the connecting line of the shared bonding pads.

Wherein the PCB comprises two shared bonding pads, five resistors are connected to the same input line, three out of the five resistors are connected to the input line with their access pins overlapped with one shared bonding pad located in the overlapped area, two out of the three resistors are symmetrically arranged at two sides of the connecting line of the shared bonding pads, vertical to the other resistor; and the other two out of the five resistors are connected to the input line with their access pins overlapped with another shared bonding pads located in the overlapped area, arranged to be vertical to each other.

Wherein the PCB comprises four shared bonding pads arranged in line, ten resistors are connected to the same input line, four out of the ten resistors are connected to the input line with their access pins overlapped, the four shared bonding pad are located in the overlapped area respectively, both of the shared bonding pads located in the ends of the connecting line of the shared bonding pads connect to three resistors with two out of the three resistors symmetrically arranged at two sides of the connecting line of the shared bonding pads, and the two out of the three resistors are vertical to the other resistor of the three; and each of the shared bonding pads located in the middle of the connecting line of the shared bonding pads connects to two resistors vertical to the connecting line of the shared bonding pads.

Wherein the PCB comprises five shared bonding pads and ten resistors connect to the same input line, every two out of the ten resistors share one of the five shared bonding pads and are symmetrically arranged at two sides of the connecting lines of the five shared bonding pads.

As at least two out of the resistors are connected to the same input line with the access pins overlapped, the utilization of space is maximized. In this way, not only the dimension of the PCB is reduced, but also the manufacturing cost is reduced at the same time.

DETAILED DESCRIPTION OF THE EMBODIMENTS

Embodiments of the invention will now be described more fully hereinafter with reference to the accompanying drawings, in which embodiments of the invention are shown.

Figure 1:
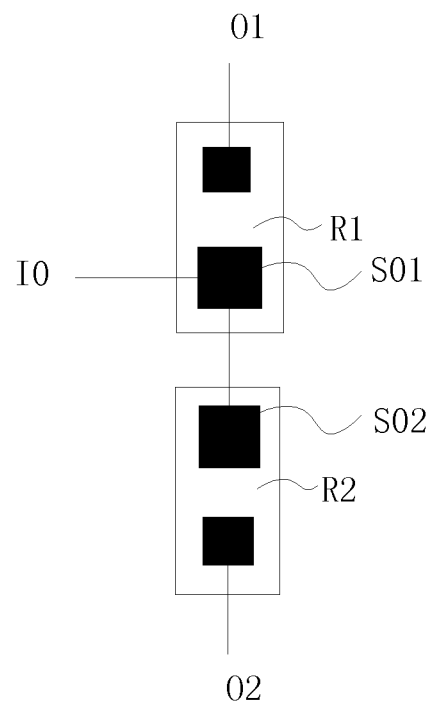
FIG. 1 is a schematic view of bonding pads of PCB according to the prior art.
Figure 2:
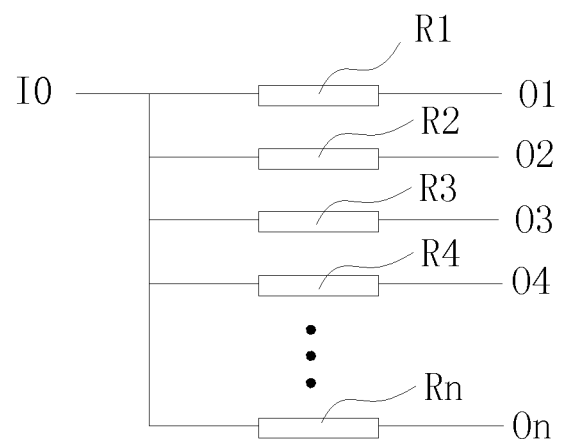
FIG. 2 is a schematic view of one input line connected with a plurality of output lines.

As shown in FIG. 2, the access pins of the resistors R1, R2, ..., Rn are connected to the same input line I0, and the other pin of the resistors R1, R2, ..., Rn are connected to different output lines O1, O2, ..., On, wherein n is an integer larger than or equal to 2. In this way, the resistors of the PCB are bonded with components to activate the connection therebetween. In the claimed invention, at least two access pins of the resistors are overlapped so as to share the bonding pad. As such, the idle bonding pad is avoid and the utilization of space is maximized.

In the claimed invention, the access pins of a variety of resistors on the PCB are connected to the same input line I0. At least two access pins of the resistors are overlapped so as to share the bonding pad, and the circuit components are mounted on the shared bonding pad.

First Embodiment

Figure 3:
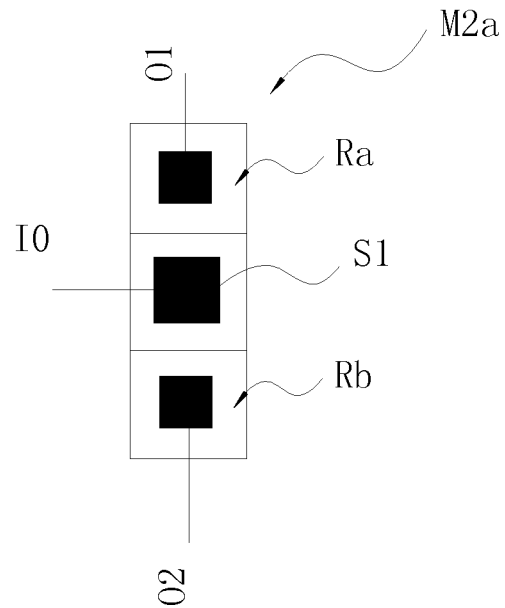
FIG. 3 is a schematic view of one configuration of the resistors and the bonding pad on the PCB in accordance with a first embodiment.

FIG. 3 is a schematic view of one configuration of the resistors and the bonding pad on the PCB in accordance with a first embodiment. The two resistors Ra, Rb and a first shared bonding pad S1 form a first dual module M2a. The access pins of the resistors Ra, Rb are overlapped and connect with the input line I0. The other access pins of the resistors Ra, Rb respectively connect to different output lines O1, O2. The first shared bonding pad S1 is located in the overlapped area. Within the first dual module M2a, the resistor Ra and the resistor Rb are arranged in line.

Second Embodiment

Figure 4:
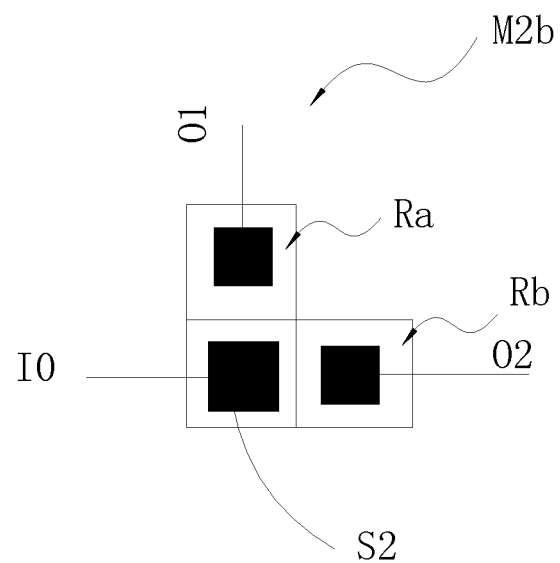
FIG. 4 is a schematic view of one configuration of the resistors and the bonding pad on the PCB in accordance with a second embodiment.

FIG. 4 is a schematic view of one configuration of the resistors and the bonding pad on the PCB in accordance with a second embodiment. The resistors Ra, Rb and a second shared bonding pad S2 form a corner dual module M2b. The access pins of the resistor Ra and the resistor Rb are overlapped and connect to the input line I0 via the second shared bonding pad S2. The other pins of the resistor Ra and the resistor Rb respectively connect to different output lines O1, O2. The second shared bonding pad S2 is located in the overlapped area. Within the corner dual module M2b, the resistor Ra and the resistor Rb are arranged to be vertical to each other.

Third Embodiment

Figure 5:
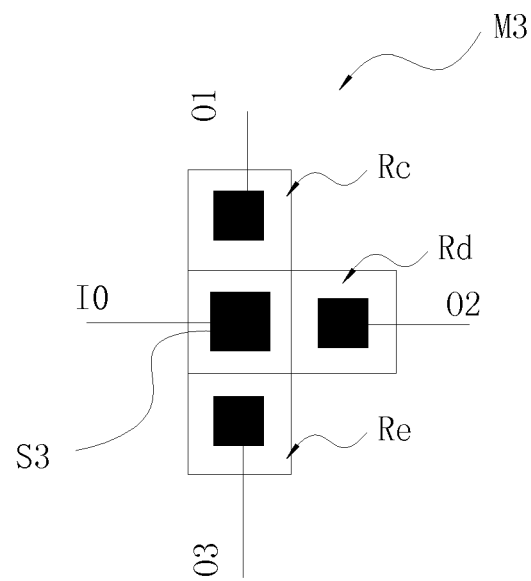
FIG. 5 is a schematic view of one configuration of the resistors and the bonding pad on the PCB in accordance with a third embodiment.

FIG. 5 is a schematic view of one configuration of the resistors and the bonding pad on the PCB in accordance with a third embodiment. As shown, the three resistors Rc, Rd, Re and a third shared bonding pad S3 form a ternary module M3. The access pins of the resistors Rc, Rd, Re connecting to the input line I0 are overlapped. The overlapped location is arranged with the third shared bonding pad S3. The other pins of the resistors Rc, Rd, Re respectively connect to the output lines O1, O2, O3. Specifically, the resistor Rc and the resistor Re are arranged in line. The resistor Rd is vertical to the resistors Rc, Re.

Fourth Embodiment

Figure 6:
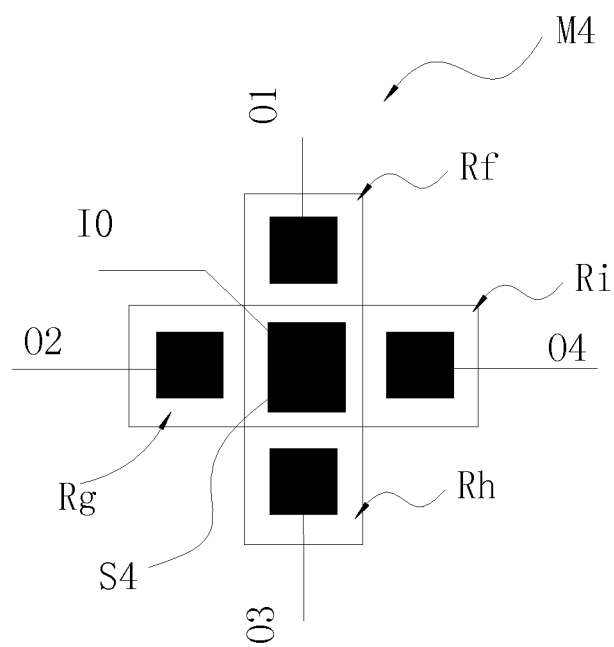
FIG. 6 is a schematic view of one configuration of the resistors and the bonding pad on the PCB in accordance with a fourth embodiment.

FIG. 6 is a schematic view of one configuration of the resistors and the bonding pad on the PCB in accordance with a fourth embodiment. As shown, the resistor Rf, Rg, Rh, Ri and the fourth shared bonding pad S4 form a quad module M4. The resistor Rf, Rg, Rh, Ri connects to the input line I0 and the access pins are overlapped. The overlapped location is arranged with the fourth shared bonding pad S4. The other pins of the resistor Rf, Rg, Rh and Ri respectively connects to different output lines O1, O2, O3 and O4. With the quad module M4, any two of the resistors Rf, Rg, Rh, and Ri are vertical to other two.

Fifth Embodiment

Figure 7:
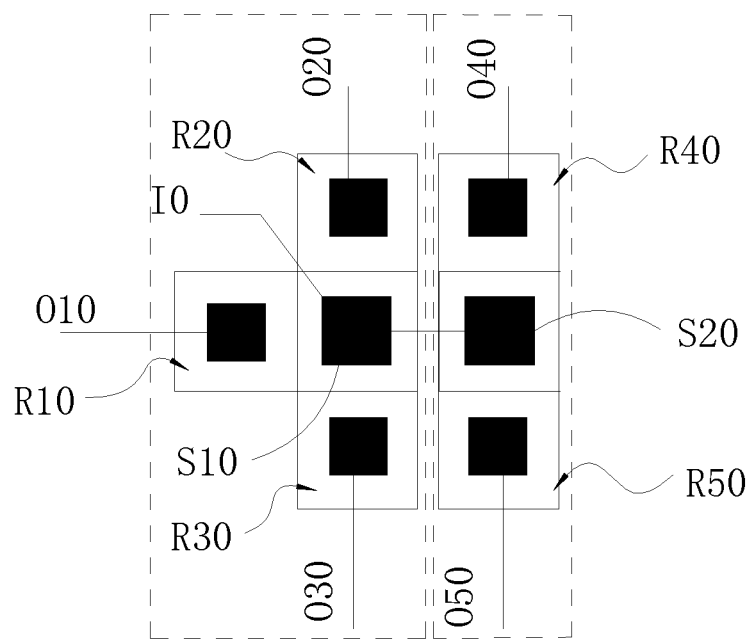
FIG. 7 is a schematic view of one configuration of the resistors and the bonding pad on the PCB in accordance with a fifth embodiment.

FIG. 7 is a schematic view of one configuration of the resistors and the bonding pad on the PCB in accordance with a fifth embodiment. When the number of the resistors connecting to the same input line I0 is larger than four, it is needed to configure a plurality of adjacent bonding pads that are electrically connected. At least one of the shared bonding pads is connected to the input line I0, and the bonding pad and the resistors are separated to a plurality of modules. The modules may be configured in accordance with the first dual module M2a, the corner dual module M2b, the ternary module M3, and the quad module M4 as described in the above-mentioned embodiments to avoid the idle bonding pad.

As shown in FIG. 7, five resistors is taken as an example to illustrate the configuration of the shared bonding pad. Referring to FIG. 7, two shared bonding pads may be configured when the resistors R10, R20, R30, R40, R50 connect to the same input line I0. The fifth shared bonding pad S10 and the sixth bonding pad S20 separate the five resistors into a ternary module and a dual module. Specifically, the resistors R10, R20, R30 and the fifth shared bonding pad S10 are configured as one ternary module, and the resistors R40, R50 and the sixth shared bonding pad S20 are configured as one dual module. The fifth shared bonding pad S10 and the sixth shared bonding pad S20 are electrically connected. That is, the access pins of the resistors R10, R20, R30 connecting to the input line I0 are overlapped. The fifth shared bonding pad S10 is located in the overlapped area. The resistor R20 and the resistor R30 are symmetrically arranged at two sides of the connecting line of the fifth shared bonding pad S10 and the sixth shared bonding pad S20. The resistor R20 is vertical to another resistor R10. In addition, the access pins of the resistors R40, R50 connecting to the input line I0 are overlapped. A sixth shared bonding pad S20 is located in the overlapped area. The resistor R40 and the resistor R50 are symmetrically arranged at two sides of the connecting line of the fifth shared bonding pad S10 and the sixth shared bonding pad S20. The other pins of the five resistors R10, R20, R30, R40, R50 respectively connect to different output lines O10, O20, O30, O40 and O50. The input line I0 connects to the fifth shared bonding pad S10 located in one end of the connecting line of the shared bonding pads.

Sixth Embodiment

Figure 8:
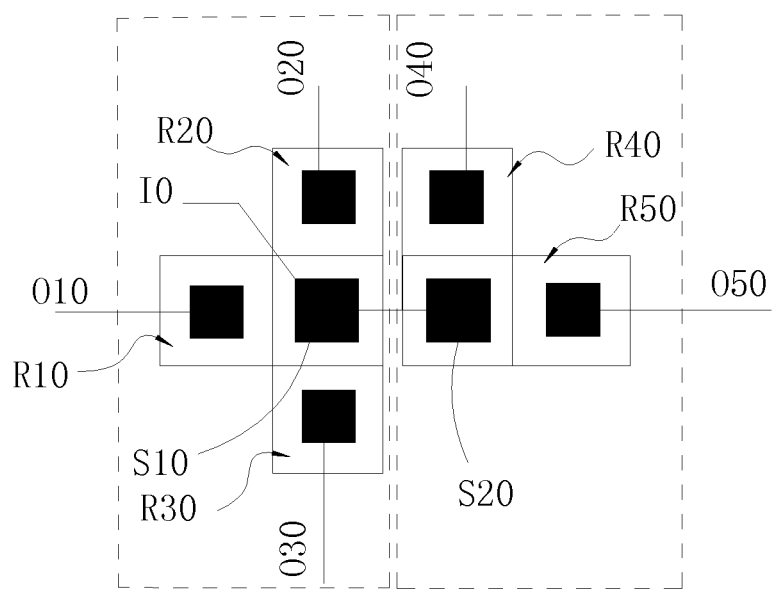
FIG. 8 is a schematic view of one configuration of the resistors and the bonding pad on the PCB in accordance with a sixth embodiment.

FIG. 8 is a schematic view of one configuration of the resistors and the bonding pad on the PCB in accordance with a sixth embodiment. The shared bonding pads are arranged to be adjacent and are electrically connected. At least one shared bonding pad is connected to the input line I0, and the shared bonding pads and the resistors are separated to a plurality of modules. The bonding pads are arranged in accordance with the combination of the first dual module M2*a*, the corner dual module M2*b*, the ternary module M3, and the quad module M4 so as to connect all of the resistors with a fewer number of the bonding pads and to avoid the idle bonding pads.

As shown in FIG. 8, at least five resistors R10, R20, R30, R40 and R50 are connected to the same input line I0, there are two shared bonding pads are arranged on the PCB. The fifth shared bonding pad S10 and the sixth shared bonding pad S20 configure the resistors R10, R20, R30 and the fifth shared bonding pad S10 as one ternary module. In addition, the resistors R40, R50 and the sixth shared bonding pad S20 are configured as one corner dual module. The fifth shared bonding pad S10 and the sixth shared bonding pad S20 are electrically connected. That is, the resistor R20 and the resistor R30 are symmetrically arranged at two sides of the connecting line of the fifth shared bonding pad S10 and the sixth shared bonding pad S20. The resistor R20 is vertical to another resistor R10. The resistor R20 and the resistor R30 are symmetrically arranged at two sides of the connecting line of the fifth shared bonding pad S10 and the sixth shared bonding pad S20. The resistor R20 is vertical to another resistor R10. At the same time, the resistors R40, R50 are arranged at one side adjacent to the resistor R20 such that the resistor R50 is vertical to the resistor R40. The other access pin of the five resistors R10, R20, R30, R40 and R50 respectively connect to different output lines O10, O20, O30, O40 and O50. The input line I0 connects to the tenth shared bonding pads S10 located in one end of the connecting line of the shared bonding pads.

Seventh Embodiment

Figure 9:
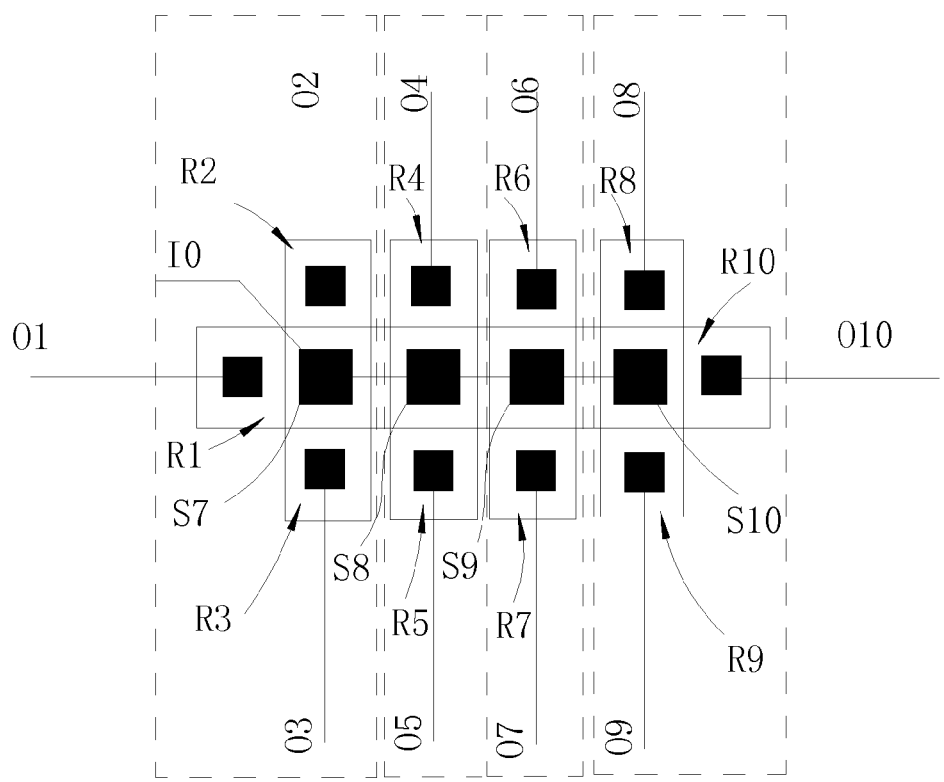
FIG. 9 is a schematic view of one configuration of the resistors and the bonding pad on the PCB in accordance with a seventh embodiment.

FIG. 9 is a schematic view of one configuration of the resistors and the bonding pad on the PCB in accordance with a seventh embodiment. The shared bonding pads are arranged to be adjacent and are electrically connected. At least one shared bonding pad is connected to the input line I0, and the shared bonding pads and the resistors are separated to a plurality of modules. The bonding pads are arranged in accordance with the combination of the first dual module M2*a*, the corner dual module M2*b*, the ternary module M3, and the quad module M4 so as to connect all of the resistors with a fewer number of the bonding pads and to avoid the idle bonding pads.

Referring to FIG. 9, there are ten resistors R1-R10 connect to the same input line I0, and four shared bonding pads, including the seventh shared bonding pads S7, the eighth shared bonding pads S8, the ninth shared bonding pads S9, and the tenth shared bonding pads S10, are arranged on the PCB. The ten resistors and the four shared bonding pads are configured to be two ternary modules M3 and two dual modules. Specifically, the resistors R1, R2, R3 and the seventh shared bonding pads S7 are configured as one ternary module M3. The resistors R8, R9, R10 and the tenth shared bonding pads S10 are configured as another ternary module. The other four resistors R4, R5, R6 and R7 respectively connect to the eighth shared bonding pads S8 and the ninth shared bonding pads S9 to be two dual modules. Afterward, the seventh shared bonding pads S7, the eighth shared bonding pads S8, the ninth shared bonding pads S9, and the tenth shared bonding pads S10 are electrically connected in sequence. The input line I0 connects to the seventh shared bonding pads S7 located in one end of the connecting line of the shared bonding pad. That is, the ten resistors connects to the same input line I0, and respectively connect to different output lines O1~O10. The four shared bonding pads S7, S8, S9, S10 are arranged in line. The four shared bonding pads are located in the overlapped area. Specifically, the shared bonding pads located in the ends of the connected bonding pads connect to three resistors. That is, the seventh shared bonding pads S7 connects to the resistors R1, R2, R3, and the tenth shared bonding pads S10 connects to the resistors R8, R9, R10. In addition, the second resistor R2, the third resistor R3, and the eighth resistor R8, the ninth resistor R9 respectively arranged at two sides of the connecting line of the shared bonding pads in a symmetrical way. The first resistor R1 and the tenth resistor R10 respectively share the seventh shared bonding pads S7 and the tenth shared bonding pads S10. The first resistor R1 and the tenth resistor R10 are arranged at two ends of the connecting lines of the shared bonding pad. The eighth shared bonding pads S8 and the ninth shared bonding pads S9 respectively connect to the resistors R4, R5 and the resistor R6, R7. In addition, the resistors R4, R5 and the resistor R6, R7 are vertical to the connecting line of the four shared bonding pads.

Eighth Embodiment

Figure 10:
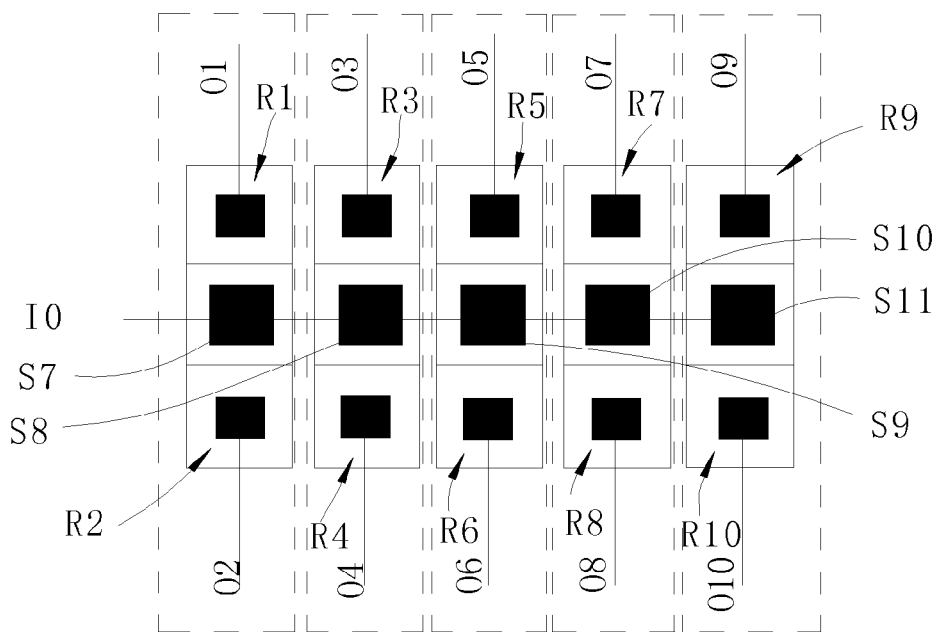
FIG. 10 is a schematic view of one configuration of the resistors and the bonding pad on the PCB in accordance with an eighth embodiment.

FIG. 10 is a schematic view of one configuration of the resistors and the bonding pad on the PCB in accordance with an eighth embodiment. The shared bonding pads are arranged to be adjacent and are electrically connected. At least one shared bonding pad is connected to the input line I0, and the shared bonding pads and the resistors are separated to a plurality of modules. The bonding pads are arranged in accordance with the combination of the first dual module M2*a*, the corner dual module M2*b*, the ternary module M3, and the quad module M4 so as to connect all of the resistors with a fewer number of the bonding pads and to avoid the idle bonding pads.

Referring to FIG. 10, there are ten resistors R1-R10 connect to the same input line I0, and five shared bonding pads, including the seventh shared bonding pads S7, the eighth shared bonding pads S8, the ninth shared bonding pads S9, the tenth shared bonding pads S10, the eleventh shared bonding pads S11, are arranged on the PCB. The ten resistors and the five shared bonding pads are configured to be five dual modules. The seventh shared bonding pads S7, the eighth shared bonding pads S8, the ninth shared bonding pads S9, the tenth shared bonding pads S10 and the eleventh shared bonding pads S11 are electrically connected in sequence. The input line I0 connects to the seventh shared bonding pads S7 located in one end of the connecting line of the shared bonding pads. The ten resistors connects to the same input line I0, and respectively connect to different output lines O1~O10. Every two out of the ten resistors shared the same bonding pad, and the ten resistors are symmetrically arranged at two sides of the connecting line of the five shared bonding pads. Specifically, the resistors R1, R2 share the seventh shared bonding pads S7, the resistors R3, R4 share the eighth shared bonding pads S8, the resistors R5, R6 share the ninth shared bonding pads S9, the resistors R7, R8 share the tenth shared bonding pads S10, and the resistors R9, R10 share the eleventh shared bonding pads S11.

It can be understood that the number of the resistors is not limited to the above-mentioned embodiments. When the number of the resistor connecting to the same input line I0 is larger than four, the shared bonding pads and the resistors may be configured to be a plurality of modules in accordance with the first dual module M2a, the corner dual module M2b, the ternary module M3, the quad module M4 as described above. The shared bonding pads are arranged to be adjacent and are electrically connected so as to connect one of the shared bonding pads to the input line I0. As such, all of the resistors may be connected via a minimum number of the bonding pads.

In view of the above, the resistors connecting to the same input line I0 may be configured with a plurality of shared bonding pads to form the first dual module M2a, the corner dual module M2b, the ternary module M3, and the quad module M4, and then the modules are electrically connected via wires to avoid idle bonding pads. In this way, the usage of solder paste for bonding the electrical components is minimized, and the utilization of the space of the PCB is enhanced, which not only reduces the dimension of the PCB, but also reduces the manufacturing cost at the same time.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A printed circuit board (PCB), comprising:
   pins of a plurality of resistors on the PCB being connected to the same input line, at least two out of the resistors are connected to the input line with their access pins overlapped, one shared bonding pad is located in every overlapped area, and electrical components is bonded on the shared bonding pads; and
   wherein when the number of the resistors connecting to the same input line is larger than four, a plurality of adjacent shared bonding pads are electrically connected, and at least one of the shared bonding pad is connected to the input line.

2. The PCB as claimed in claim 1, wherein two out of the resistors are connected to the input line with their access pins overlapped, one shared bonding pad is located in the overlapped area, and the two resistors are arranged in line.

3. The PCB as claimed in claim 1, wherein two out of the resistors are connected to the input line with their access pins overlapped, one shared bonding pad is located in the overlapped area, and the two resistors are vertical to each other.

4. The PCB as claimed in claim 1, wherein three out of the resistors are connected to the input line with their access pins overlapped, one shared bonding pad is located in the overlapped area, and two out of the three resistors are arranged in line, and the two resistors are vertical to the other resistor.

5. The PCB as claimed in claim 1, wherein four out of the resistors are connected to the input line with their access pins overlapped, one shared bonding pad is located in the overlapped area, and every resistor out of the four resistors is arranged to be vertical to the nearby one.

6. The PCB as claimed in claim 1, wherein the PCB comprises two shared bonding pads, five resistors are connected to the same input line, three out of the five resistors are connected to the input line with their access pins overlapped with one shared bonding pad located in the overlapped area, symmetrically arranged at two sides of the connecting line of the shared bonding pads and vertical to the other resistor; and
   the other two out of the five resistors are connected to the input line with their access pins overlapped with another shared bonding pad located in the overlapped area, symmetrically arranged at two sides of the connecting line of the shared bonding pads.

7. The PCB as claimed in claim 1, wherein the PCB comprises two shared bonding pads, five resistors are connected to the same input line, three out of the five resistors are connected to the input line with their access pins overlapped with one shared bonding pad located in the overlapped area, two out of the three resistors are symmetrically arranged at two sides of the connecting line of the shared bonding pads, vertical to the other resistor; and
   the other two out of the five resistors are connected to the input line with their access pins overlapped with another shared bonding pad located in the overlapped area, arranged to be vertical to each other.

8. The PCB as claimed in claim 1, wherein the PCB comprises four shared bonding pads arranged in line, ten resistors are connected to the same input line, four out of the ten resistors are connected to the input line with their access pins overlapped, the four shared bonding pad are located in the overlapped area respectively, both of the shared bonding pads located in the ends of the connecting line of the shared bonding pads connect to three resistors with two out of the three resistors symmetrically arranged at two sides of the connecting line of the shared bonding pads, and the two out of the three resistors are vertical to the other resistor of the three; and
   each of the shared bonding pads located in the middle of the connecting line of the shared bonding pads connects to two resistors vertical to the connecting line of the shared bonding pads.

9. The PCB as claimed in claim 1, wherein the PCB comprises five shared bonding pads and ten resistors connect to the same input line, every two out of the ten resistors share one of the five shared bonding pads and are symmetrically arranged at two sides of the connecting lines of the five shared bonding pads.

* * * * *